(12) United States Patent
Shih et al.

(10) Patent No.: US 8,013,339 B2
(45) Date of Patent: Sep. 6, 2011

(54) THIN FILM TRANSISTORS AND ARRAYS WITH CONTROLLABLE THRESHOLD VOLTAGES AND OFF STATE LEAKAGE CURRENT

(76) Inventors: Ishiang Shih, Brossard (CA); Cindy X. Qiu, Brossard (CA); Chunong Qiu, Brossard (CA); Yi-Chi Shih, Palos Verdes Estates, CA (US)

( * ) Notice: Subject to any disclaimer, the term of this patent is extended or adjusted under 35 U.S.C. 154(b) by 164 days.

(21) Appl. No.: 12/455,290

(22) Filed: Jun. 1, 2009

(65) Prior Publication Data

US 2010/0301340 A1    Dec. 2, 2010

(51) Int. Cl.
*H01L 29/04* (2006.01)
(52) U.S. Cl. ............ 257/59; 257/327; 257/406; 438/216
(58) Field of Classification Search .................... 257/59, 257/327, 406; 438/261
See application file for complete search history.

(56) References Cited

U.S. PATENT DOCUMENTS 5,409,851 A * 4/1995 Oh ................................ 438/159
2007/0252206 A1* 11/2007 Yamazaki et al. ............ 257/347

* cited by examiner

*Primary Examiner* — Thanh V Pham
*Assistant Examiner* — Caleb Henry

(57) ABSTRACT

Thin film transistors and arrays having controlled threshold voltage and improved $I_{ON}/I_{OFF}$ ratio are provided in this invention. In one embodiment, a thin film transistor having a first gate insulator of high breakdown field with positive fixed charges and a second gate insulator with negative fixed charges is provided; said negative fixed charges substantially compensate said positive fixed charges in order to reduce threshold voltage and OFF state threshold voltage of said transistor. In another embodiment, a thin film transistor having a first passivation layer with negative fixed charges is provided, the negative charges reduce substantially unwanted negative charges in the adjacent active channel and hence reduce the OFF state current and increase $I_{ON}/I_{OFF}$ ratio, which in turn reduce the threshold voltage of the transistor.

20 Claims, 7 Drawing Sheets

THIN FILM TRANSISTORS AND ARRAYS WITH CONTROLLABLE THRESHOLD VOLTAGES AND OFF STATE LEAKAGE CURRENT

FIELD OF THE INVENTION

This invention is related to thin film transistors for electronic and optoelectronic applications. More specifically, it relates to thin film transistors with controllable threshold voltages and reduced OFF state currents.

BACKGROUND ON THE INVENTION

Thin Film Transistor Technology

In large area electronic circuits such as active-matrix liquid crystal display (AM-LCD) technology, active-matrix organic light emitting displays (AM-OLED) and x-ray imagers, thin film transistors (TFTs) are used to form the switching circuits. At least one thin film transistor is required to form into a pixel of the circuits.

Figure 1:
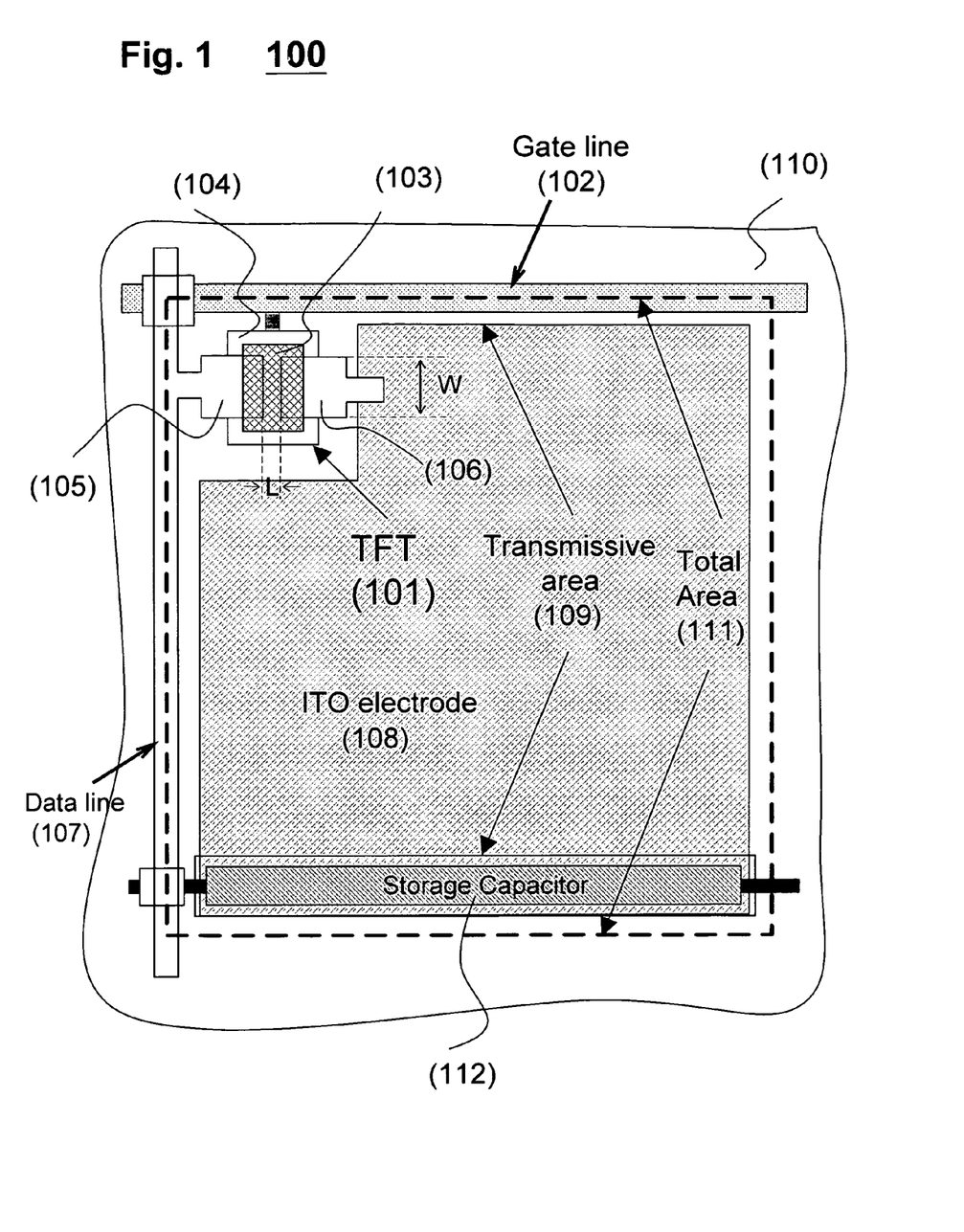
FIG. 1 A schematic diagram of a pixel (100) in typical AM-LCD technology.

A schematic diagram of a pixel (100) in typical AM-LCD technology is shown in FIG. 1. A TFT (101) is deposited on a first substrate (110). During operation, the TFT (101) behaves like a variable resistor with low $R_{ON}$ in ON state and high $R_{OFF}$ in OFF state. The ON and OFF states of TFT are controlled by the voltage supplied from the gate select line (102) to the gate electrode (not shown) which turns ON or OFF the active channel layer (103). The gate electrode and the gate select line (102) are connected together electrically. A layer of gate insulator (104) is deposited over the gate electrode whereas an active channel (103) is deposited to cover the gate insulator (104) and overlap the gate electrode. Metal layers are then deposited to overlap part of the active channel (103) to form source (105) and drain (106). The source (105) is connected to a data line (107) and the drain (106) is connected to an ITO pixel electrode (108) which is conductive and optically transparent. When the TFT (100) is turned ON, charges supplied from the data line (107) to represent the brightness of the pixel can be allowed to flow through the source (105) to the drain (106) to reach the ITO pixel electrode (108). These charges will be used to turn on liquid crystal or to turn on OLED materials. Majority of the ITO electrode (108) thus defines the transmissive area (109) which is smaller than the total area (111). To form the LCD units, a second substrate (not shown) with a conductive and optically transparent layer is brought over the first substrate (110), with the conductive layer on the second substrate facing the surface of the first substrate (110) where the TFT (101) and pixel electrodes (108) are deposited. The rise time of the pixel voltage when turned on should be short while the time to hold the charges (charge retention time) should be long. In order to achieve long enough charge retention time, a storage capacitor $C_S$ (112) with capacitance value substantially larger than that of the liquid crystal cell is usually inserted into each pixel to minimize the unwanted discharging. As the main components in the backplanes of AM-LCDs, the device performance of TFTs often determines the quality of the displays, such as response times and contrast ratios. Therefore, the search for high performance TFTs has never stopped.

Electrical Performance Requirements for TFTs

Figure 2A:
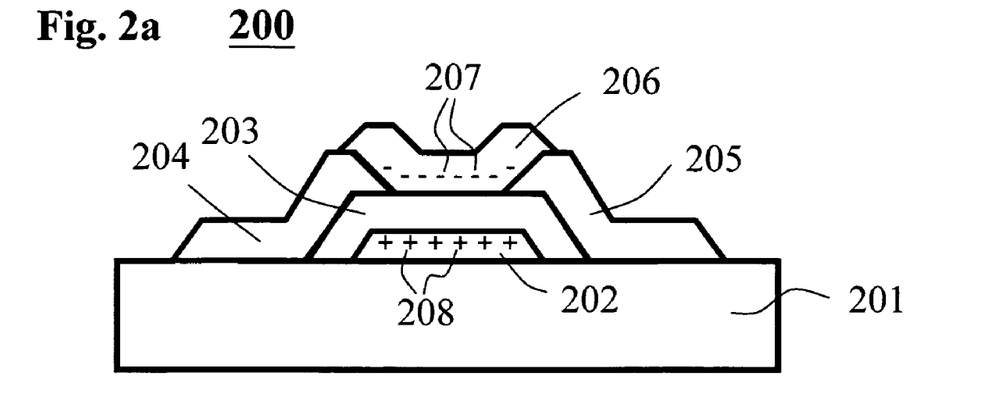
FIG. 2a-c Cross-sectional views of a bottom gate TFT (200) of n-type semiconductor, showing the effect of positive fixed charges in gate insulator (203).

The parameters important to the operation of a TFT include response time, threshold voltage and ON/OFF current ratio ($I_{ON}/I_{OFF}$). For TFTs utilizing active channel semiconductors having high carrier mobility, the values of $I_{ON}$ are large enough to reduce the resistance and to ensure a short RC time constant during charging of the pixel, which is equal to $R_{ON} \times C_S$ (where $R_{ON}$ is the ON resistance of the TFT and $C_S$ is the capacitance of the storage capacitor (112)). However, for TFTs with high mobility active channels, the values of $I_{OFF}$ are often more sensitive to processing conditions and can be quite large even with a small amount of unwanted remnant chargers in the channels. These remnant chargers can be induced by fixed charges in the gate insulator (104) adjacent to the bottom surface region of the active channel (103) or by fixed charges in a passivation layer on the top surface region of the active channel. In addition to the values of $I_{OFF}$ in the TFTs, the control of threshold voltage is also difficult to achieve. In many applications, it is preferable to control the value of the threshold voltage substantially to close to 0 volt. This is required so that the TFTs can be turned on by applying a voltage (positive or negative) and can be turned off by applying a reversed voltage (negative or positive). The principles are made more clear by referring to FIG. 2a, where a cross-sectional view of an example TFT (200) on a substrate (201) is shown to have a metal gate electrode (202), an gate insulator (203), a source (204), a drain (205) and an active channel (206) of n-type semiconductor. To simplify the explanation, a bottom gate electrode TFT structure has been adopted in FIG. 2a. In an ideal situation, first negative charges (207) will be induced in the active channel (103) when positive charges (208) are induced in the bottom gate electrode (202) by a first voltage (or gate voltage) with the positive polarity applied to the metal gate electrode (202) and with the negative polarity to the source (204). When a second voltage (or drain voltage) is applied between the drain (205) and source (204), a current will flow from the drain to the source and the TFT (200) is in an ON state. When a reversed gate voltage is applied with the negative polarity to the metal gate electrode (202) and the positive polarity to the source (204), the TFT (200) is turned off. Although the TFT is in an OFF state, a minimum but unwanted amount of negative charges will be induced and a minimum current, $I_{OFF}$, will flow with the second voltage applied between the drain (205) and source (204). Ideally, the value of $I_{OFF}$ should be as small as possible in order to achieve a long charge retention time.

Figure 2B:
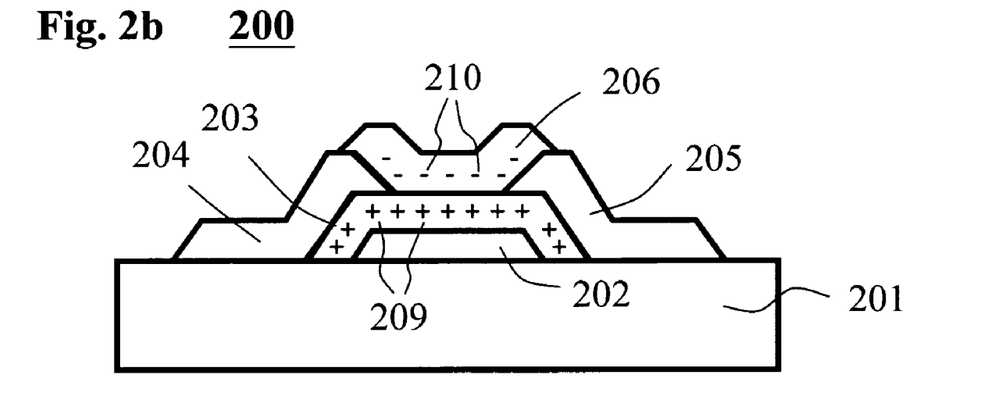

In many practical TFTs, the gate insulators used are silicon nitrides or silicon oxides formed by a PECVD method. For sufficient operation of the TFT, the key requirement for the gate insulator is a high breakdown electric field. However, in gate insulators made of PECVD silicon nitrides or silicon oxides there are always positive fixed charges (209) as depicted in FIG. 2b. The density of the positive fixed charges (209) is often large especially for those oxides and nitrides with high breakdown electric fields. For instance, the density of the positive fixed charges can be as high as $10^{12}$ cm$^{-2}$. These positive fixed charges (209) will induce same density of second negative charges (210) in the bottom surface region of the channel layer (206) even without the application of a gate voltage. Therefore, a current will flow from the drain (205) to the source (204) when a second voltage is applied across them and the TFT (200) is in an ON state even without the application of the gate voltage.

When a positive gate voltage is applied with the positive polarity to the gate electrode (202) and the negative polarity to the source (204), certain amount of the first negative charges (207, shown in FIG. 2a) will be induced in the active channel (206) on top of the already existing second negative charges (210), making the resistance of the active channel (206) to be even smaller. Hence, with the second voltage applied between the drain (205) and the source (204), a current larger than that before applying the first gate voltage will flow from the drain to the source.

Figure 2C:
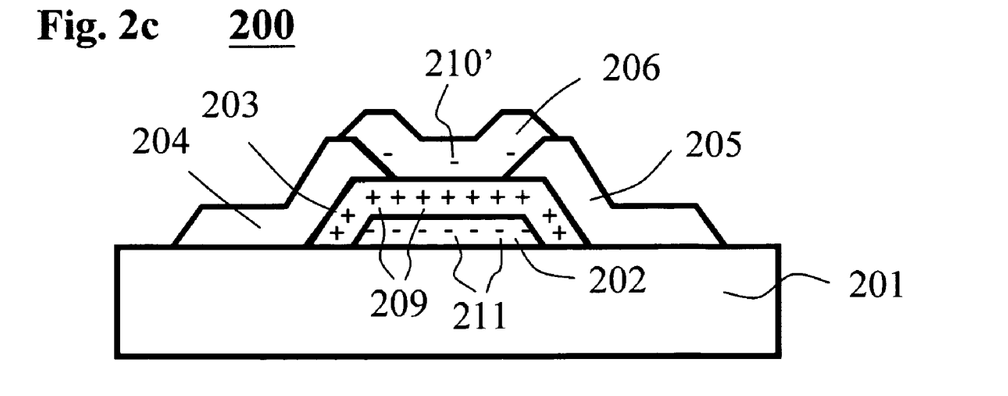
Figure 3:
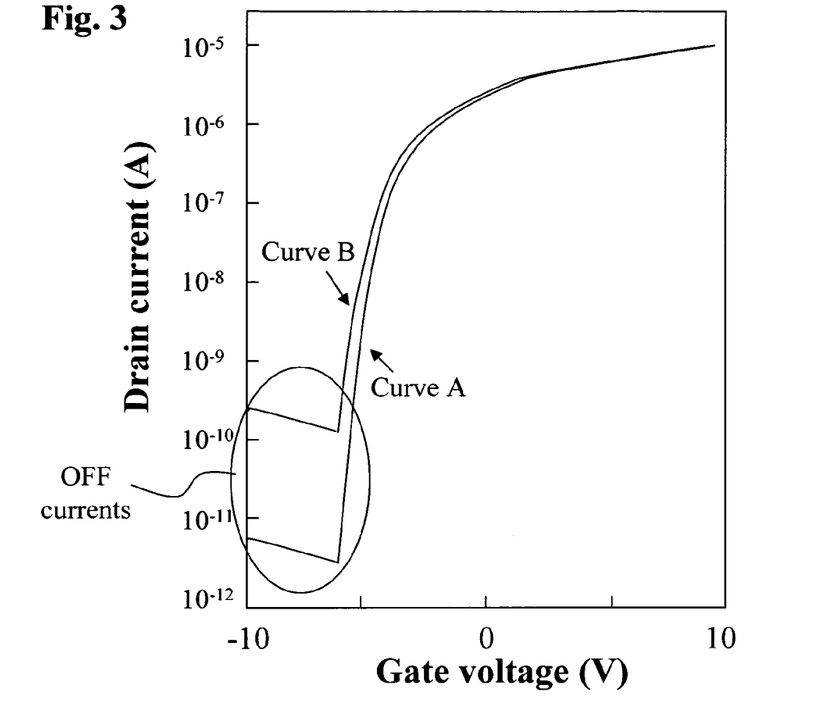
FIG. 3 Drain current versus gate voltage with a fixed drain voltage, with (Curve B) and without (Curve A) the effects of positive fixed charges in the passivation layer.

However, due to the existence of the second negative charges (210) induced by the positive fixed charge (209) in the gate insulator (203), the TFT (200) is already in an ON state without the application of a positive gate voltage. Therefore, a gate voltage with negative polarity and sufficiently large magnitude must be applied in order to supply negative charges (211) to the metal gate electrode (202), as depicted in FIG. 2c, to compensate the second negative charges (210) induced by the positive fixed charges (209) in the gate insulators (203). This results in a minimum amount of second negative charges (210') in the active channel (206). Hence, the threshold voltages of the TFTs with positive fixed charges (209) in the gate insulators are often negative. In such cases, when a fixed voltage is applied between the drain and the source, the drain current will vary with the variation of the gate voltage in a manner shown by Curve A in FIG. 3.

Figure 4A:
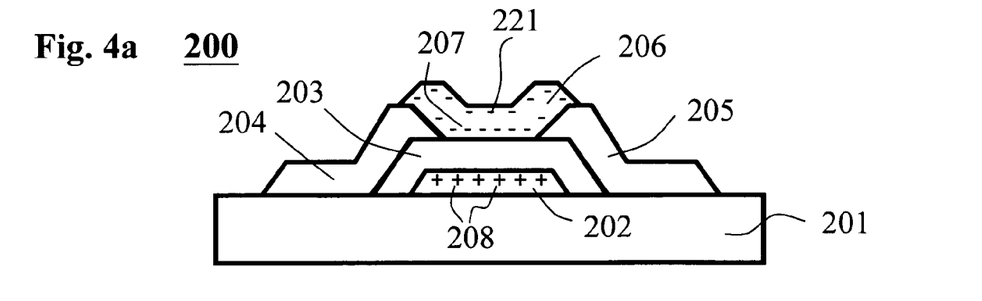
FIG. 4a-d Cross-sectional views of a bottom gate TFT (200) of n-type semiconductor, showing the effects of third negative charges (221) and positive fixed charges (224) in the passivation layer (223).
Figure 4B:
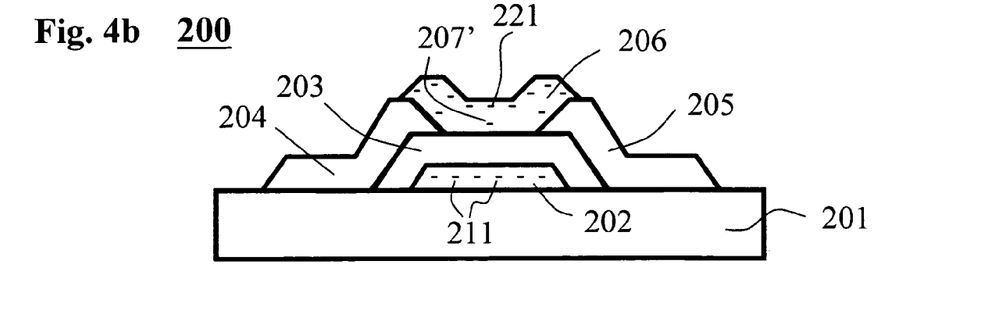

In addition to the first and second negative charges, there are also third negative charges (221) as shown in FIG. 4a induced op surface region of the active channel (206). The third negative charges (221) are often formed during the fabrication or caused by exposure to atmosphere after the fabrication. Unlike the first and the second negative charges (207 and 210), the third negative charges (221) are not the results of induction and are fixed in nature (please check if this is true). Although the application of a negative gate voltage can remove (compensate) the first negative charges (207) and the second negative charges (210) in the active channel (206), the third negative charges (221) can not be removed as effectively. In order to simplify the situation, a TFT without positive fixed charges (209) in the gate insulator (203) and therefore exclusive of second negative charges (210) in the active channel (206), is depicted in FIG. 4b to demonstrate the effects of the third negative charges (221). When a voltage with negative polarity is applied to the metal gate electrode (202) to supply negative charges (211), majority of the first negative charges (207), induced by a previously applied positive gate voltage can be removed to result in a minimum amount of the first negative charges (207'). Therefore, as shown in FIG. 4b, even when a negative gate voltage with a large value is applied in an attempt to turn off the TFT (200), a significant portion of the third negative charges (221) remained near the top surface region of the active channel (206). This will conduct a current when the second voltage is applied across the drain (205) and the source (204) and constitutes an unwanted leakage current. Hence, when a fixed drain voltage is applied, the drain current will vary with the gate voltage in a manner as shown in Curve B in FIG. 3 where the OFF current for the TFT with the third negative charges (221) is substantially larger compared to that for a TFT without the third negative charges (221) (shown by curve A). As a direct result of the third negative charges (221) in the active channel, the $I_{ON}/I_{OFF}$ ratio is reduced. These third negative charges (221) may be caused by the ions or polar molecules adhere to the top surface of the active channel (206) during and after fabrication.

Figure 4C:
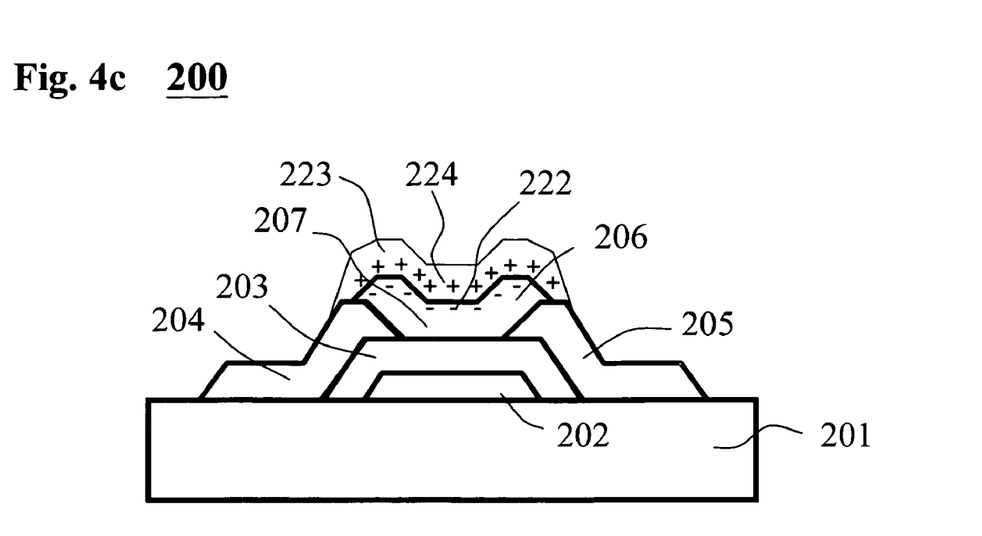

As illustrated in FIG. 4c, a fourth negative charges (222) may also be induced by a passivation layer (223), deposited on the top surface of the active channel (206) for protection purposes. This passivation layer (223) often contains positive fixed charges (224) and will induce the fourth negative charges (222) in the top surface region of the active channel (206). The negative charges (222) will add to the total negative charges in the channel region and affect the operation of the TFT, including threshold voltage and OFF state leakage current.

OBJECTS OF THE INVENTION

One object of this invention is to provide thin film transistor structures having a controllable threshold voltage and reduced OFF state current.

One other object of the present invention is to provide TFT structures having controllable total induced charges in the active channel layer in order to adjust the threshold voltages and the OFF state current of the TFTs. Controlling of the total induced charges is achieved by controlling the density of fixed charges in the gate insulators and the passivation layer and by controlling the thickness of the gate insulators and the passivation layer.

Another object of the present invention is to provide TFT structures having one gate insulator layer with high breakdown electric field and containing fixed insulator charges which are negative for n-channel TFTs and positive for p-channel TFTs, in order to control the total induced charges in the active channel. Such control leads to a controllable threshold voltage, a reduced OFF state current and an increased $I_{ON}/I_{OFF}$ ratio.

Yet another object of the present invention is to provide thin film transistor structures having at least two gate insulators containing opposite fixed insulator charges in order to control the total induced charges in the active channel. Such control leads to a controllable threshold voltage, a reduced OFF state current and an increased $I_{ON}/I_{OFF}$ ratio.

Still another object of this invention is to provide thin film transistor structures having a passivation layer with fixed charges, which are negative for n-channel TFTs and positive for p-channel TFTs, in order to control the total induced charges in the active channel adjacent the passivation layer so that the magnitude of the threshold voltage and the OFF state leakage current of the TFT is reduced.

PREFERRED EMBODIMENTS

In order to simplify the following descriptions, only n-channel TFT structures with controllable threshold voltage and reduced OFF state current are presented. However, it should be apparent to anyone of skill in the art that p-channel TFT structures with controllable threshold voltage and reduced OFF state current can be obtained by changing sign of the fixed charges in the gate insulators and the passivation layer. Furthermore, TFTs of top gate structure with controllable threshold voltage and reduced OFF state current can be easily obtained by modify the bottom gate structures presented below.

Figure 5:
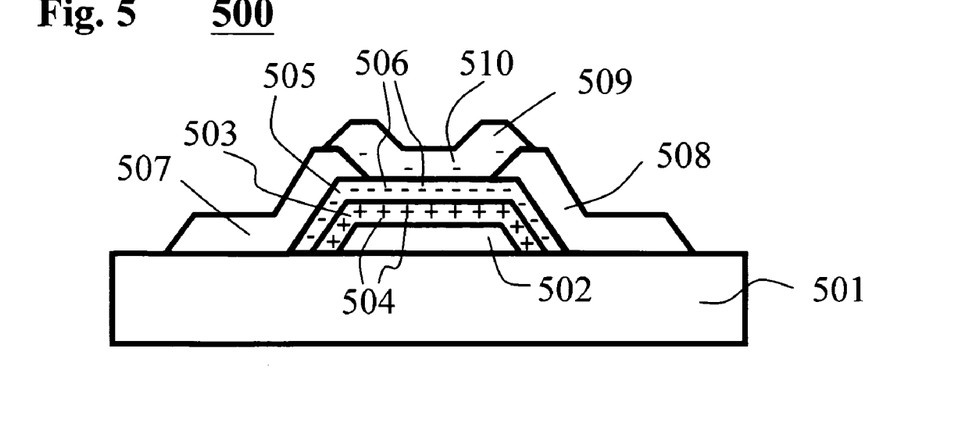
FIG. 5 A cross-sectional view of an n-channel TFT (500) with a normal double gate insulators structure, where the first gate insulator (503) having a positive first fixed charges (504) and the second gate insulator (505) having a negative second fixed charges (506), according to present invention.

[1] Normal Double Gate Insulators:

A preferred embodiment of this invention is illustrated in FIG. 5 where a cross section of a n-channel TFT (500) is shown to have a first substrate (501), a first gate electrode (502), a first gate insulator (503) having a first fixed charges (504), a second gate insulator (505) having a second fixed charges (506), a source (507) with projection of which overlaps a first portion of said first gate electrode (502), a drain (508) with a projection of which overlaps a second portion of said first gate electrode, and a first active channel (509). The first substrate (501) may be selected from glass substrates, plastic substrates and dielectric-coated metal substrates. The first active channel (509) is made of a n-type semiconductor which may be selected from a material group comprising: amorphous silicon (Si), poly Si, metal oxides such as indium oxide, zinc oxide, tin oxide, gallium oxide and their alloys, metal oxynitrides such as indium oxynitride, zinc oxynitride, tin oxynitride, gallium oxynitride and their alloys. When a substrate other than glass is used for (501), an additional surface coating may be required to improve adhesion and to reduce unwanted penetration of moisture or oxygen.

Although a single first active channel (509) is illustrated in the TFT shown in FIG. 5, it is clear that in circuit application, such TFTs may contain two or even three active channels connected in series in order to increase OFF state resistance. Furthermore, the drain (508) may have a periphery which is longer than that for the source (507), in order to improve uniformity of heat dissipation arising from the reduced carrier density near the drain contact. While FIG. 5 and above description have been made in reference to a bottom gate TFT structure, it is equally feasible to adopt a top gate TFT structure for the present device. It should be pointed out that even though n-type channel TFT is described for demonstration purposes, p-channel TFTs can also be made to have gate insulator with negative fixed charges to reduce threshold voltage and OFF state current of the TFTs.

In FIG. 5, the first gate insulator (503) may be selected from silicon nitride, silicon oxide and silicon oxynitride with large breakdown electric field. As mentioned before, the first gate insulator (503) may be deposited using methods such as PECVD and by adjusting deposition conditions to yield high breakdown electric field required for TFT operation. In the first gate insulator (503), there is presence of positive first fixed charges (504) with a definite surface charge density. The surface charge density of the positive first fixed charges (504) may be in a range of $10^9$ cm$^{-2}$ to $4\times10^{12}$ cm$^2$.

These positive first fixed charges (504) induce negative charges in the active channel (509). The induced negative charges have a surface density substantially similar to that of the positive first fixed charges (504). Therefore, in the case that only the first gate insulator (503) is adopted, the induced negative charges in the active channel (509) will make said TFT to be a normally ON device. An inconveniently large magnitude of voltage is needed to apply to the first gate electrode (502) in order to remove said induced negative charges.

According to this invention, in order to reduce the magnitude of the gate voltage required to turn OFF the TFT (500), a second gate insulator (505) having a second fixed charges (506) is adopted, said second fixed charges (506) have a negative sign (opposite to that of the first fixed charges (504) in the first gate insulator (503)) and a surface charge density substantially close to that of the first fixed charges (504). Said second fixed charges (506) cancel substantially the effects of said first fixed charges (504) and significantly reduce the density of total negative charges (510) induced in the active channel (509) and consequently reduce the magnitude of gate voltage required to turn OFF said TFT. Therefore, according to this invention, the amount of total negative charges (510) induced in the active channel (509) is reduced by adopting the second gate insulator (505) containing negative fixed charges (506). As a result, OFF state current of the TFT (500) is reduced and the $I_{ON}/I_{OFF}$ ratio is improved. Materials of said second gate insulator (505) may be selected from a group of oxides, nitrides, fluorides and their mixtures which contain negative fixed charges when deposited in a thin film form. Materials other than the above listed items may be adopted provided that there are negative fixed charges in said materials when deposited in a thin film form. Examples of such materials include: aluminum oxide ($Al_2O_3$), aluminum nitride, aluminum oxynitride (AlON), aluminum fluoride, hafnium oxide ($HfO_2$), nitrogen-doped $HfO_2$ ($HfO_2$:N) and their mixtures. The deposition methods for the second gate insulator may include PECVD, sputtering and evaporation. Thickness of the deposited second gate insulator is 10-200 nm. The negative fixed charge density of above-mentioned materials is in the range of $10^{10}$ to $5\times10^{12}$ cm$^{-2}$, and is higher in $Al_2O_3$, AlF and $HfO_2$ when annealed in air.

The controlling of the total induced negative charges (510) is achieved by controlling the densities of fixed charges in the two gate insulators through fabrication conditions adjustments. The total induced negative charges (510) can be further controlled through adjusting the relative thickness of the first gate insulator (503) and the second gate insulator (505).

In this normal double gate insulator structure, the first gate insulator (503) containing positive fixed charges (504) provides the large breakdown electric field the TFT (500) required, the second gate insulator (505) with negative fixed charges (506) reduce the total induced negative charges in the active channel adjacent to the gate insulators.

Figure 6:
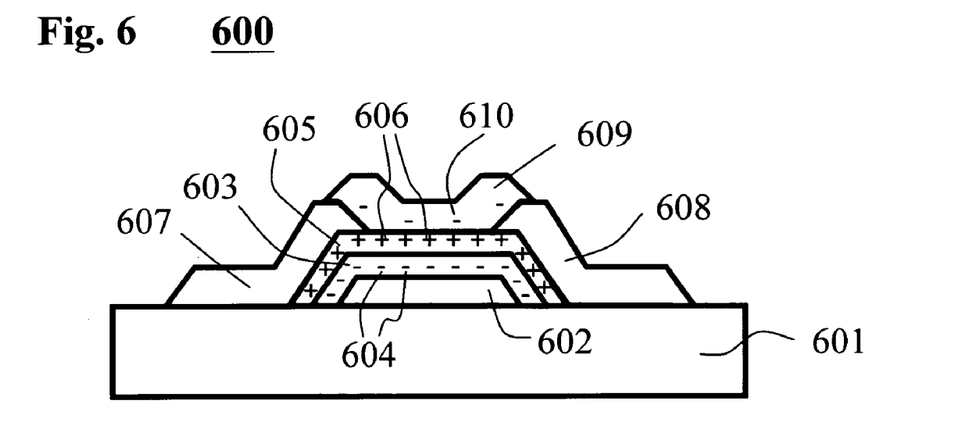
FIG. 6 A cross section of an n-channel TFT (600) with a reversed double gate insulators structure, where the first gate insulator (603) having a negative first fixed charges (604) and the second gate insulator (605) having a positive second fixed charges (606), according to this invention.

[2] Inverted Double Gate Insulators:

Another preferred embodiment of this invention is illustrated in FIG. 6 where there is shown a cross section of a TFT (600) on a first substrate (601), having a first gate electrode (602), a first gate insulator (603) having a first fixed charges (604), a second gate insulator (605) having a second fixed charges (606), a source (607) with projection of which overlaps a first portion of said first gate electrode (602), a drain (608) with a projection of which overlaps a second portion of said first gate electrode (602) and a first active channel (609). Said first active channel may be selected from a material group comprising: amorphous Si, poly Si, metal oxides such as indium oxide, zinc oxide, tin oxide, gallium oxide and their alloys, metal oxynitrides such as indium oxynitride, zinc oxynitride, tin oxynitride, gallium oxynitride and their alloys. Said first substrate (601) may be selected from glass substrates, plastic substrates and dielectric-coated metal substrates. When a substrate other than glass is used, an additional surface coating may be required to improve adhesion and to reduce unwanted penetration of moisture or oxygen.

Although a single first channel (609) is illustrated in the TFT shown in FIG. 6, it is clear that in circuit application, such TFTs may contain two or even three channels connected in series in order to increase OFF resistance of the TFT. Furthermore, the drain (608) may have a periphery which is longer than that for the source (607), in order to improve uniformity of heat dissipation arising from the reduced carrier density near the drain contact. While FIG. 6 and above description have been made in reference to a bottom gate TFT structure, it is equally feasible to adopt a top gate TFT structure for the present device.

According to FIG. 6 of this invention, in order to reduce the magnitude of gate voltage required to turn OFF the TFT while maintain a large breakdown electric field for the gate insulators, the first gate insulator (603) is selected to have negative first fixed charges (604) and the second gate insulator (605) is selected to have positive second fixed charges (606); the surface density of the first fixed charges (604) and the second fixed charges (606) are considerably identical. Said first fixed charges (604) cancel substantially the effects of said second fixed charges (606) and greatly reduce the density of total induced negative charges (610) in the active channel (609). This in turn decreases the magnitude of gate voltage required to turn OFF said TFT. According to the present invention, due to the reduction of the total induced negative charges (610) by adopting the first gate insulator (603), current in the OFF state is reduced and the ratio of $I_{ON}/I_{OFF}$ is increased. Said first gate insulator (603) may be selected from a material group of oxides, nitrides, fluorides and their mixtures containing negative fixed charges when deposited in a thin film form. Materials other than the above listed items may be adopted as long as there are negative fixed charges in said materials when deposited in a thin film form. Some examples include: aluminum oxide ($Al_2O_3$), aluminum nitride, aluminum oxynitride (AlON), aluminum fluoride, hafnium oxide ($HfO_2$), nitrogen-doped $HfO_2$ ($HfO_2$:N) and their mixtures. The deposition methods for the first gate insulator (603) may include PECVD, sputtering and evaporation. Thickness of the deposited first gate insulator is 10-200 nm. The negative fixed charge density of above-mentioned materials is in the range of $10^{10}$ to $5 \times 10^{12}$ cm$^{-2}$, and is higher in $Al_2O_3$, AlF and $HfO_2$ when annealed in air. If a TFT contains only the first gate insulator (603) with negative first fixed charges (604), it will require a large positive gate voltage to turn ON said TFT and the TFT is an enhancement mode device.

The second gate insulator (605) may be selected from silicon nitride, silicon oxide and silicon oxynitride with large breakdown electric field. As mentioned before, the second gate insulator (605) may be deposited using methods such as PECVD. Through adjusting deposition conditions, high breakdown electric field required for TFT operation can be obtained. Values of surface charge density of said positive second fixed charge (606) may be in a range of $10^9 \sim 4 \times 10^{12}$ cm$^{-2}$. When the first fixed charges (604) and the second fixed charges (606) are controlled to have substantially the same surface density, the negative charges induced by the positive second fixed charges (606) and the positive charges induced by the negative first fixed charges (604) will cancel each other making said TFT to have a threshold voltage substantially close to zero volt. Only a conveniently small magnitude of negative gate voltage is needed in order to remove the remaining total negative charges (610) in the active channel and to turn OFF the TFT.

The controlling of the total induced negative charges (610) is achieved by controlling the densities of fixed charges in the two gate insulators through fabrication conditions adjustments. The total induced negative charges (610) can be further controlled through adjusting the relative thickness of the first gate insulator (603) and the second gate insulator (605).

In this inverted double gate insulator structure (600), the second gate insulator (605) containing positive second fixed charges (606) provides the large breakdown electric field the TFT required, the first gate insulator (603) with negative first fixed charges (604) reduce the total induced negative charges in the active channel adjacent to the gate insulators.

Figure 7:
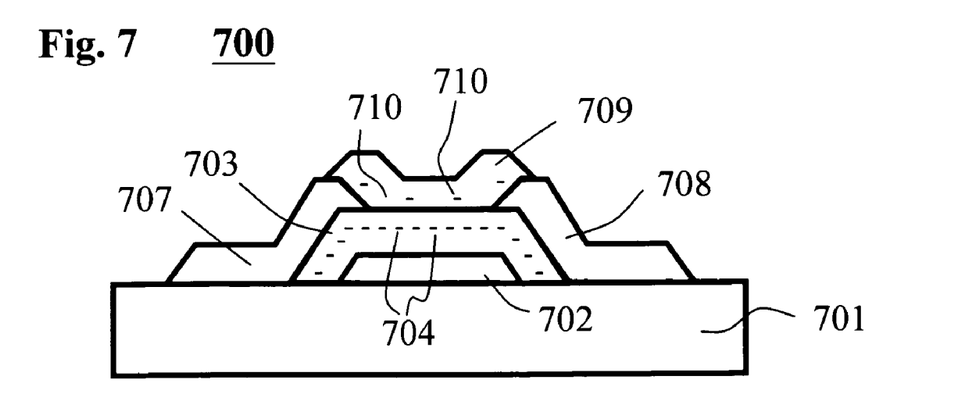
FIG. 7 A cross section of an n-channel TFT (700) with a single gate insulator having negative fixed charges (704), according to the present invention.

[3] Single Gate Insulators with Negative Fixed Charges:

Yet another preferred embodiment of this invention is illustrated in FIG. 7 where a TFT (700) is shown having a first substrate (701), a first gate electrode (702), a first gate insulator (703) having a negative first fixed charges (704), a drain (707) with projection overlapping a first portion of said first gate electrode, a source (708) with a projection overlapping a second portion of said first gate electrode and a first active channel (709). Said first active channel (709) may be selected from a material group comprising: amorphous Si, poly Si, metal oxides such as indium oxide, zinc oxide, tin oxide, gallium oxide and their alloys, metal oxynitrides such as indium oxynitride, zinc oxynitride, tin oxynitride, gallium oxynitride and their alloys. Said first substrate (701) may be selected from glass substrates, plastic substrates and dielectric-coated metal substrates. When a substrate other than glass is used, an additional surface coating may be required to improve adhesion and to reduce unwanted penetration of moisture or oxygen.

Although a single first active channel (709) is illustrated in the TFT shown in FIG. 7, it is clear that in circuit application, such TFTs may contain two or even three channels connected in series in order to increase OFF resistance. Furthermore, the drain (707) may have a periphery which is longer than that for the source (708), in order to improve uniformity of heat dissipation arising from the reduced carrier density near the drain contact. While FIG. 7 and above description have been made in reference to a bottom gate TFT structure, it is equally feasible to adopt a top gate TFT structure for the present device.

According to this invention, in order to increase the breakdown electric field of the first gate insulator (703) bearing negative first fixed charges (704), deposition rate of said first gate insulator is reduced whereas a substrate temperature is maintained during the deposition of said first gate insulator. In such manner, said first gate insulator (703) containing negative first fixed charges (704) may be used directly as the gate insulator without the need of a second gate insulator which often has positive fixed charges. Hence, by adopting the first gate insulator layer (703) having negative first fixed charges (704), the density of the total induced negative charges (710) in the active channel (709) will be reduced and the magnitude of the gate voltage required to turn OFF the TFT (700) will be small.

According to this invention, due to the reduction of the total induced negative charges (710) by the negative first fixed charges (704) in the first gate insulator (703), the OFF state current is reduced and the $I_{ON}/I_{OFF}$ ratio is increased. Said first gate insulator (703) may be selected from a group of oxides, nitrides, fluorides and their mixtures containing negative fixed charges when deposited in a thin film form. Materials other than the above listed items may be adopted as long as there are negative fixed charges in said materials when deposited in a thin film form. Examples include: aluminum oxide ($Al_2O_3$), aluminum nitride, aluminum oxynitride (AlON), aluminum fluoride, hafnium oxide ($HfO_2$), nitrogen-doped $HfO_2$ ($HfO_2$:N) and their mixtures. The deposition methods may include PECVD, sputtering and evaporation.

Figure 4D:
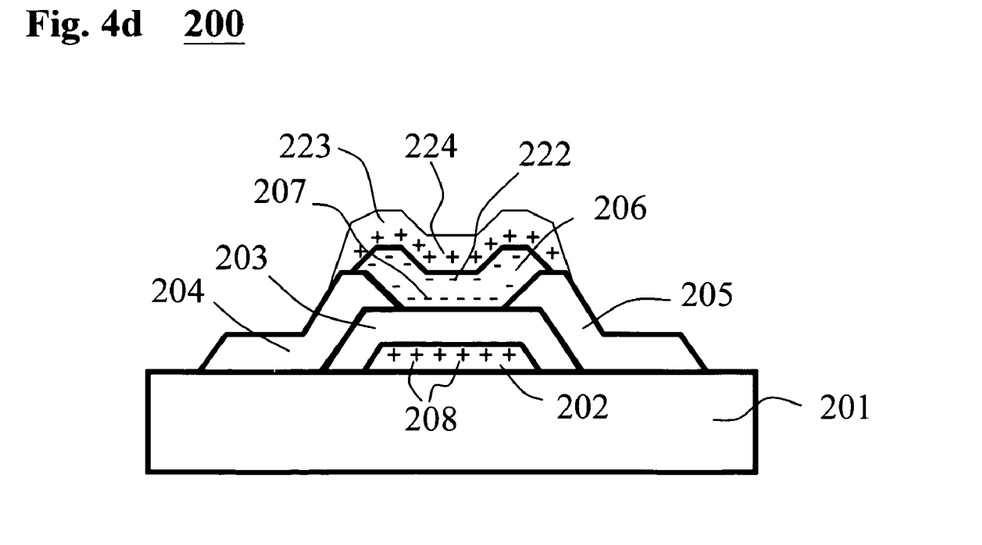

[4] Passivation Layer Containing Negative Fixed Charges:

As depicted in FIGS. 4c and 4d, during the manufacturing of TFTs, a passivation layer (223) is often deposited on top of the TFT (200), to cover the main part of the first active channel (206). This passivation layer (223) is required in order to protect the active channel (206) from further contaminations when exposed to atmosphere. The basic requirements of this passivation layer (223) are high electrical resistivity and resistance to penetration of moisture or molecules in atmosphere. For amorphous Si TFT technology, a layer of silicon nitride (or silicon oxides, in some cases) passivation layer (223) is often adopted. This silicon nitride passivation layer is prepared by PECVD and will contain positive third fixed charges (224). As indicated in FIG. 4d, the positive third fixed charges (224) in the silicon nitrides passivation layer (223) will induce negative charges (222) in the top surface region of the active channel (206). Hence, even when all other negative charges (including the negative charges (207) induced by positive charges (208) in the gate electrode, and negative charges induced by fixed charges (not shown in FIGS. 4c and 4d) in the gate insulator (203)) have been minimized by the application of a negative voltage to the first gate electrode (203), an electrical current still can flow from the drain (205) to the source (204) when a drain voltage is applied, giving rise to an unwanted increase in the OFF state current $I_{OFF}$. Hence, the $I_{ON}/I_{OFF}$ ratio will decrease due to the deposition of the passivation layer (223) containing positive fixed charges (224). In order to overcome the presence of positive charges in the required passivation layer, special process has been developed in the industry to etch the "back channel". However, such etching may not be applicable for the TFTs involving high mobility channel materials such as metal oxides and metal oxynitrides.

Figure 8:
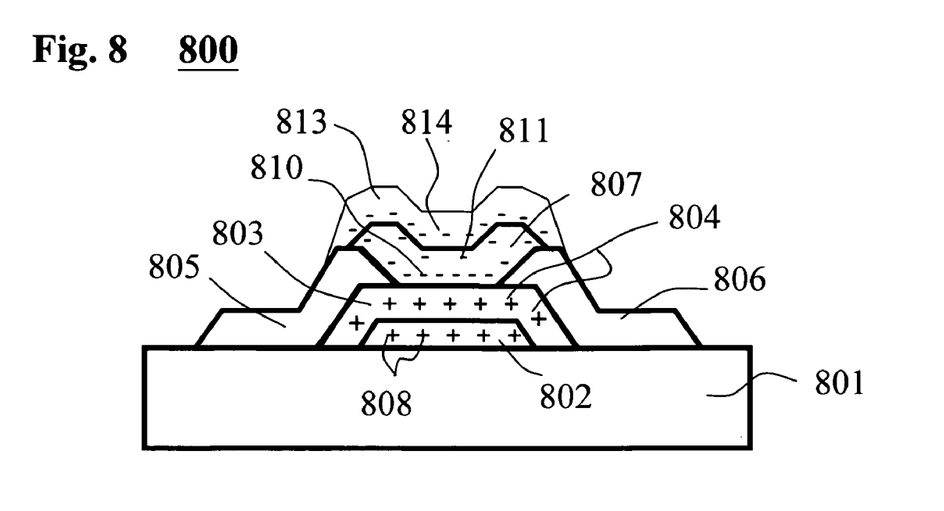
FIG. 8 A cross section of an n-channel TFT (800) with a passivation layer (813) having negative fixed charges (814), according to the present invention.

Therefore, according to still another embodiment of this invention, as illustrated in cross-sectional form in FIG. 8, a TFT (800) is fabricated on a first substrate (801). It consists of a first gate electrode (802), a first gate insulator (803) having a first fixed charges (804) which are positive, a drain (805) with projection overlapping a first portion of said first gate electrode (802), a source (806) with a projection overlapping a second portion of said first gate electrode (802), and a first active channel (807) having a first negative charges (810) in the bottom surface region of the active channel (807) and a second negative charges (811) in the top surface region of the active channel (807). The first negative charges (810) is induced by positive charges (808) in the first gate electrode (802) and first fixed charges (804) in the first gate insulator (803), whereas the second negative charges (811) in the top surface region is formed during or after the fabrication due to exposure to atmosphere. A first passivation layer (813) having a negative fixed charges (814) covers at least a portion of said first active channel (807) so that the density of the total negative charges in the active channel layer (807) is reduced due to the compensation effects of the negative fixed charges (814) in the first passivation layer (813). With this reduction in the density of the second negative charges (811), when a negative voltage is applied to the first gate electrode (802) to minimize density of the negative charges (810 and 811) and to turn OFF the TFT, the electrical current to flow from drain (805) to source (806) will be reduced. This reduction in the OFF current will lead to an increase in the ratio of $I_{ON}/I_{OFF}$ of the TFT (800) and reduce substantially the magnitude of the threshold voltage. Some material examples of first passivation layer (813) include: aluminum oxide ($Al_2O_3$), aluminum nitride, aluminum oxynitride (AlON), aluminum fluoride, hafnium oxide ($HfO_2$), nitrogen-doped $HfO_2$ ($HfO_2$:N) and their mixtures. The deposition methods for the first passivation layer (813) may include PECVD, sputtering and evaporation. The negative fixed charge density of above-mentioned materials is in the range of $10^{10}$ to $5\times10^{12}$ $cm^{-2}$, and is higher in $Al_2O_3$, AlF and $HfO_2$ when annealed in air.

Figure 9:
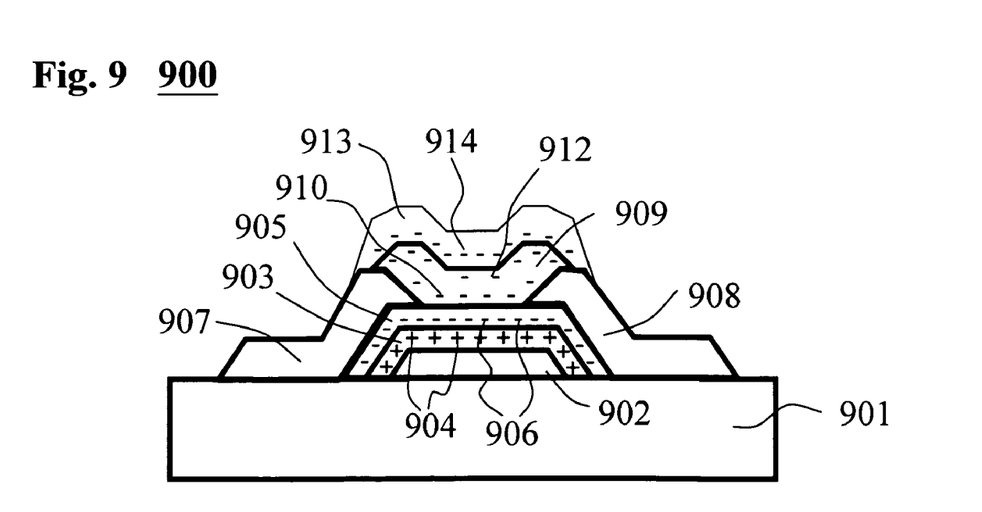
FIG. 9 A cross section of an n-channel TFT (900) with a normal double gate insulator structure and a passivation layer (913) having negative fixed charges (914), according to the present invention.

[5] Combination of a Passivation Layer Containing Negative Fixed Charges with a Second Gate Insulator Having Negative Fixed Charges:

According to still another embodiment of the present invention, a first passivation layer containing negative fixed charges may be advantageously combined with the second gate insulator containing negative charges as illustrated in FIG. 9. Therefore, as illustrated in cross-sectional form in FIG. 9, a TFT (900) is fabricated on a first substrate (901), having a first gate electrode (902), a first gate insulator (903) having a first fixed charges (904) which are positive, a second gate insulator (905) having a second fixed charges (906) which are negative, a drain (907) with projection overlapping a first portion of said first gate electrode (902), a source (908) with a projection overlapping a second portion of said first gate electrode (902) and a first active channel (909). The first active channel (909) contains first negative charges (910) in the bottom surface region of the channel and second negative charges (911) in the top surface region of the channel. A first passivation layer (913) having a negative third fixed charges (914). Said first passivation layer covers at least a portion of said first active channel (909) so that density of said second negative charges (912) in the active channel (909) is greatly reduced due to compensation of the negative third fixed charges (914) in said first passivation layer (913). Similarly, the density of the first negative charges (910) in the bottom surface region of the channel (909) is also decreased significantly due to the double gate insulator structure and its opposite signs for the fixed charges in the first and second gate insulators (903 and 905), positive in the first gate insulator and negative in the second insulator.

As a results of the much reduced first negative charges (910) and second negative charges (912) in the active channel (909), when a negative voltage is applied to said first gate electrode (902) to minimize density of said first negative charges (910) and said second negative charges (912) and to turn OFF said TFT (900), the current flowing from drain (908) to source (907) will be reduced. This reduction in the OFF current will lead to an increase in the ratio of $I_{ON}/I_{OFF}$ and reduce substantially the magnitude of the threshold voltage.

It should be pointed out that an inverted double gate insulator structure, where the first gate insulator contains negative fixed charges and the second gate insulator contains positive fixed charges can also be combined with a passivation layer with negative fixed charges to reduce induced negative charges in the active channel.

Deposition Methods

Aluminum Oxynitride (AlON) by e-Beam

Aluminum oxynitride (AlON) layers are deposited by e-beam evaporation from a crucible containing aluminum oxynitride and in an environment containing nitrogen. Pressure of nitrogen gas is controlled to be less than $4\times10^{-4}$ torr (in order to have a sufficiently long mean free path. The presence of nitrogen molecules will reduce the loss of nitrogen or oxygen during the evaporation and improve the quality of the deposited AlON films.

Aluminum Oxide ($Al_2O_3$) by e-Beam

Aluminum oxide layers are deposited by e-beam evaporation from a crucible containing aluminum oxide and in an environment containing oxygen. Pressure of oxygen is controlled to be less than $4\times10^{-4}$ torr in order to have a sufficiently long mean free path. The presence of oxygen molecules will reduce the loss of oxygen during the evaporation and improve the quality of the deposited $Al_2O_3$ films.

Aluminum Oxynitride (AlON) by Reactive Evaporation

Aluminum oxynitride layers are deposited by thermal evaporation from a tungsten filament containing aluminum and in an environment containing a mixture of nitrogen and oxygen. Pressure of the mixture of nitrogen and oxygen is controlled to be less than $4\times10^{-4}$ torr in order to have a sufficiently long mean free path. The presence of nitrogen and oxygen molecules will permit the evaporating aluminum atoms/molecules to react with the oxygen and nitrogen to form AlON. To make the reaction more complete, substrate heating during the evaporation may be needed. The AlON film quality may also be improved by carrying out a post deposition annealing either in oxygen or in a mixture of oxygen and nitrogen at a temperature higher than 200° C.

Aluminum Oxide ($Al_2O_3$) by Reactive Evaporation

Aluminum oxide layers are deposited by thermal evaporation from a tungsten filament containing aluminum and in an environment containing oxygen. Pressure of the oxygen is controlled to be less than $4\times10^{-4}$ torr in order to have a sufficiently long mean free path. The presence of oxygen molecules will permit the evaporating aluminum atoms/molecules to react with the oxygen to form $Al_2O_3$. To make the reaction more complete, substrate heating may be needed. The $Al_2O_3$ quality may also be improved by carrying out a post deposition annealing in oxygen at a temperature higher than 200° C.

Aluminum Fluoride ($AlF_3$) by Evaporation $AlF_3$ films with negative charges may be obtained by thermal evaporation under proper conditions. As an example, $AlF_3$ films with negative charges can be formed by evaporating $AlF_3$-$3H_2O$ at a source temperature of about 1200° C. and a pressure of about $10^{-6}$ torr. Tungsten wool may be used to prevent $AlF_3$-$3H_2O$ powder from spattering during the evaporation. In order to obtain $AlF_3$ films with a sufficient amount of negative fixed charges, the substrates should be heated to about 300° C. during the deposition. If intentional substrate heating has not been applied during the evaporation, the $AlF_3$ films should be annealed post-evaporation, preferably in vacuum at temperatures higher than 350° C. for 30 minutes to 60 minutes.

Determination of Fixed Charges in the Deposited Gate Insulators:

The sign and density of the fixed charges in the deposited gate insulator layers can be determined by constructing metal-insulator-semiconductor (MIS) structures. In the present work, n-type Si wafers with (111) and (100) orientation were used. A thick thermally grown silicon oxide with a thickness of about 1 micrometer is first formed and patterned to create gate regions. Following the formation of a thin dry $SiO_2$ as a first gate insulator layer, a second gate insulator layer of $Al_2O_3$ or AlON is evaporated in $O_2$ or $O_2+N_2$ at a pressure of about $5\times10^{-4}$ torr onto half of the sample area as the second gate insulator. This is done to serve the purpose of comparison between the single and the double gate insulator structures. The thickness of the $Al_2O_3$ or AlON insulator after one evaporation is controlled to be about 10 nm by controlling the amount of aluminum evaporated. The sample with the evaporated $Al_2O_3$ or AlON gate insulator layer is then annealed at 300-400° C. either in oxygen or a mixture of oxygen and nitrogen to improve the quality. Gate metal areas are formed by evaporating a layer of aluminium followed by lithography and selected etching.

Figure 10:
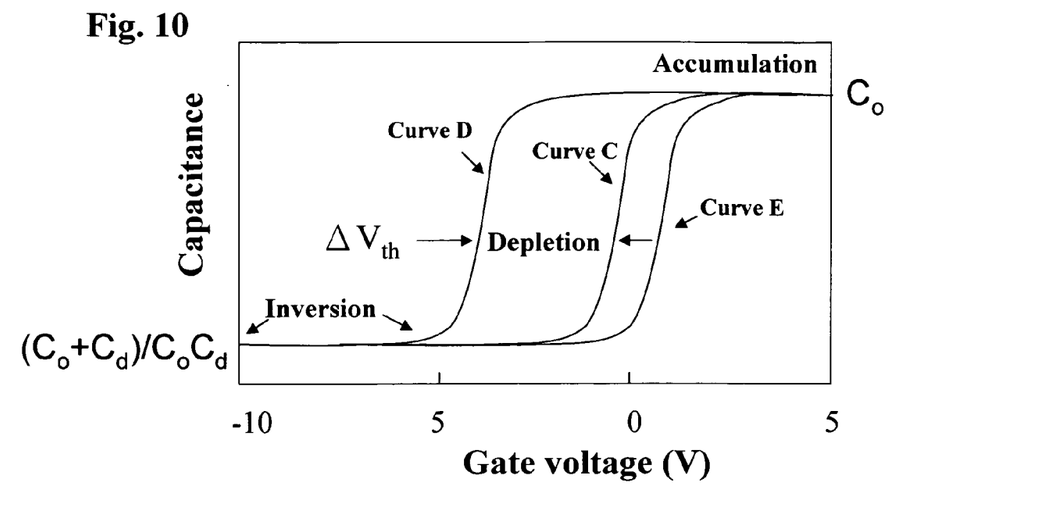
FIG. 10 Capacitance versus gate voltage for MIS structures: for an ideal device (Curve C), a MIS with single gate insulator having positive fixed charges (Curve D) and a MIS with double gate insulators (Curve E).

When a positive voltage with large enough value is applied to the gate electrode of the MIS structure, an accumulation layer will be formed under the gate insulator and the capacitance measured will be the capacitance of the gate insulator, $C_o$ (see FIG. 10). When the magnitude of voltage applied to the gate metal is reduced in magnitude or is inverted to negative values, there will be formation of a depletion layer, resulting in a depletion capacitance $C_d$ (see FIG. 10) in series with the capacitance $C_o$ of the gate insulator. Hence, the total capacitance will decrease to $(C_o+C_d)/C_oC_d$, where $C_d$ changes with applied gate voltage. When the gate voltage is decreased further (or increased in the negative direction), in addition to the depletion region, an inversion layer will form under the metal gate. When this happens, the depletion region width will reach a maximum and the total capacitance does not decrease further with further decrease in the gate voltage (see inversion region in FIG. 10). The gate voltage for the onset of the formation of the depletion layer or the inversion layer depends on the type, electron affinity and impurity concentration of the semiconductor, the work function of the metal and the fixed charges in the gate insulator.

By comparing the C—V measurement results on the MIS structure with only the first $SiO_2$ gate insulator (without the evaporated second gate insulator), with the theoretical results of an ideal MIS without any fixed charges in the first $SiO_2$ gate insulator, the sign and density of the fixed charges in the first gate insulator can be determined. As shown in FIG. 10, Curve C is the results calculated from a theoretical model using parameters and constants for an MIS structure of Al—$SiO_2$-n—Si, whereas Curve D is a plot of the actually measured data of an Al—$SiO_2$-n—Si MIS device. The relative position of the measured C—V curve (Curve D) and the theoretically calculated one (Curve C) will allow one to determine the sign of the first fixed charges in the first gate insulator (dry $SiO_2$). For n-type Si substrates, a shift of C—V curve to more negative gate voltages (from Curve C to Curve D) indicates the induction of an accumulation layer under the gate metal electrode even without the application of a gate voltage. Hence, the sign of the first fixed charges in the first gate insulator ($SiO_2$) is positive. The density of the first fixed charges $Q_{1st\ fixed}$ can be determined by $\Delta V_g = Q_{1st\ fixed}/C_o$, where $\Delta V_g$ is the magnitude of the shift in gate voltage, and $C_o$ is the capacitance of the gate insulator (or the capacitance in accumulation).

For the MIS device having the second gate insulator ($Al_2O_3$ or AlON) in addition to the first $SiO_2$ gate insulator, the C—V curve (Curve E) is shifted to the right and even beyond the theoretically calculated one (Curve C). Therefore, the second fixed insulator charges in said second gate insulator ($Al_2O_3$ or AlON) are negative. The density of said second fixed charges $Q_{2nd\ fixed}$ of the second gate insulator is determined by the magnitude of the shift in gate voltage between C—V curves (Curve E and Curve D) and $C_o$: $\Delta\Delta V_g = Q_{2nd\ fixed}/C_o$. From the experiments carried out, the $Q_{2nd\ fixed}$ is about $10^{12}/cm^{-2}$ for the second gate insulators in an AlON form. For the devices having the second gate insulator formed in pure oxygen, the value of $Q_{2nd\,fixed}$ is about $0.2\sim0.4\times10^{12}$ cm$^{-2}$. For AlF$_3$, the $Q_{2nd\,fixed}$ is $\sim0.1\sim1\times10^{12}$ cm$^{-2}$. Therefore, it is clear to those skilled in the art that there is a need to control the value of $Q_{1st\,fixed}$ (positive) to be substantially close to that of $Q_{2nd\,fixed}$ (negative) so that they effectively cancel each other and the shift of C—V curves from the ideal one (Curve C) is minimum or within a selected range of values, for applications where TFTs need to be turned ON with a positive gate voltage and to be turned OFF with a negative gate voltage. In some other cases, there may be applications where the threshold voltages need to be adjusted to be either positive or negative. This can be achieved, according to the present invention, by adjusting relative values of $Q_{1st\,fixed}$ and $Q_{2nd\,fixed}$. Furthermore, by taking capacitance measurements of MIS structures with and without the evaporated Al$_2$O$_3$ or AlON second gate insulator and comparing the gate voltage for the onset of formation of the depletion layer or the inversion layer, the sign and density of the fixed charges present in the second gate insulator may be determined.

Figure 11:
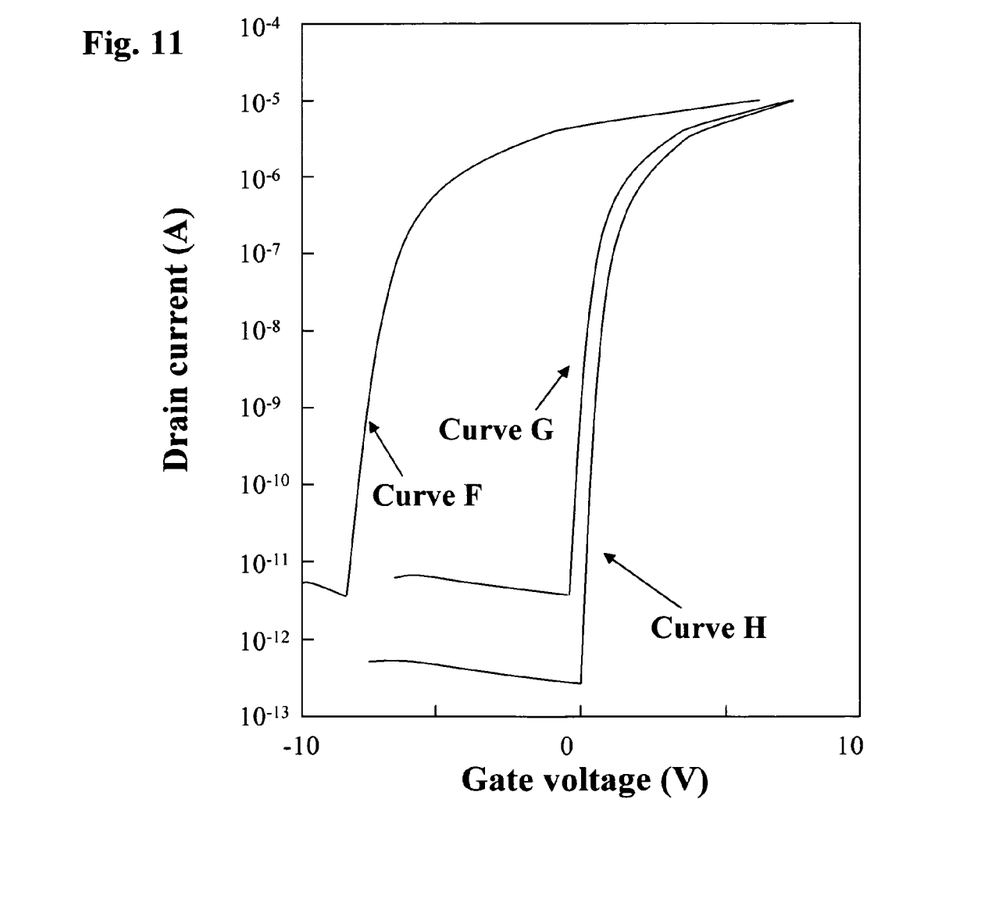
FIG. 11 Drain current versus gate voltage at a fixed drain voltage: for a TFT having a positive first fixed charges using conventional technology (Curve F), a TFT having double gate insulators according to present invention (Curve G) and a TFT with double gate insulators and a passivation layer with negative fixed charges (Curve H).

Referring now to FIG. 11, Curve F represents the drain current versus gate voltage curve at a given drain voltage for a given TFT having a positive first fixed charges using conventional technology for high mobility active channel. By adopting a second gate insulator layer having a second negative fixed charges according to this invention, characteristic curve of drain current versus gate voltage with the given drain voltage is shifted to a region with a reduced gate voltage, Curve G. The amount of $V_g$ shift being controlled by controlling relative density of second negative fixed charges in said second gate insulator layer. The unwanted flow of leakage current when the TFT is turned OFF is further reduced (Curve H) by adopting an passivation layer having a third negative fixed charges, said third negative charges minimize unwanted third negative charges induced in said active channel and lead to an increase in ratio of $I_{ON}/I_{OFF}$.

In yet another embodiment of this invention, thin film transistor arrays can be formed to have controllable threshold voltage, reduced OFF state current and increased $I_{ON}/I_{OFF}$ ratio. Each of the thin film transistors of the arrays will have at least a first gate insulator with first fixed insulator charges and a second gate insulator with second fixed insulator charges. Sign of the first fixed insulator charges is opposite to that of the second fixed insulator charges. It is also advantageous to deposit a passivation layer containing a third fixed charges, sign of the third fixed charges is negative for n-channel transistors and positive for p-channel transistors.

The foregoing description is presented for illustration of the key features and spirits of this invention. Therefore, it should not be considered in any way limitations to the present invention. For instance, p-channel TFTs with controllable threshold voltage may be obtained by adopting a double insulator containing opposite fixed charges and by adjusting the fixed charge density and the thickness of the insulators. It can also be achieved by depositing a passivation layer with positive fixed charges and by controlling the density of the positive fixed charges and its thickness.

What is claimed is:

1. A thin film transistor with controllable threshold voltage and OFF state leakage current comprising:
    a substrate,
    a first gate electrode,
    a first gate insulator layer containing first fixed insulator charges with a first fixed insulator charge density,
    a second gate insulator layer containing second fixed insulator charges with a second fixed insulator charge density,
    a drain,
    a source; and
    a first active channel,
    wherein said first fixed insulator charges and said second fixed insulator charges have opposite signs, said first fixed insulator charge density and said second fixed insulator charge density are controlled so that said first gate insulator layer and said second gate insulator layer forming an double layer gate insulator with a net fixed charge density substantially smaller than said first insulator charge density and said second fixed insulator charge density.

2. A thin film transistor with controllable threshold voltage and OFF state leakage, current according to claim 1, wherein said thin film transistor is a n-channel transistor and said controllable threshold voltage and OFF state leakage current are achieved by adjusting the density of induced negative charges in said first active channel through controlling said first fixed insulator charge density and said second fixed insulator charge density during film deposition and post deposition treatment.

3. A thin film transistor with controllable threshold voltage and OFF state leakage current according to claim 1, wherein said thin film transistor is a p-channel transistor and said controllable threshold voltage and OFF state leakage current are achieved by adjusting the density of induced positive charges in said first active channel through controlling said first fixed insulator charge density and said second fixed insulator charge density during film deposition and post deposition treatment.

4. A thin film transistor with controllable threshold voltage and OFF state leakage current according to claim 1, wherein said thin film transistor is a n-type transistor and said threshold voltage and said OFF state leakage current are further controlled by adjusting the density of induced negative charges in said first active channel through adjusting thickness of said first gate insulator layer and thickness of said second gate insulator layer.

5. A thin film transistor with controllable threshold voltage and OFF state leakage current according to claim 1, wherein said thin film transistor is a p-channel transistor and said threshold voltage and said OFF state leakage current are further controlled by adjusting the density of induced positive charges in said first active channel through adjusting thickness of said first gate insulator layer and thickness of said second gate insulator layer.

6. A thin film transistor with controllable threshold voltage and OFF state leakage current according to claim 1, wherein said first gate insulator is selected from a material group containing positive fixed charges including: silicon nitride, silicon oxide, and silicon oxynitride; and said second gate insulator is selected from a materials group containing negative fixed charges including: aluminum oxide, aluminum nitride, aluminum oxynitride, aluminum fluoride, hafnium oxide, nitrogen-doped HfO$_2$ and their mixtures.

7. A thin film transistor with controllable threshold voltage and OFF state leakage current according to claim 1, wherein said first gate insulator is selected from a material group containing negative fixed charges including: aluminum oxide, aluminum nitride, aluminum oxynitride, aluminum fluoride, hafnium oxide, nitrogen-doped HfO$_2$ and their mixtures; and said second gate insulator is selected from a materials group containing positive fixed charges including: silicon nitride, silicon oxide, and silicon oxynitride, 8. A thin film transistor with controllable threshold voltage and OFF state leakage current according to claim 1, wherein said first fixed insulator charge density and said second fixed insulator charge density are controlled by adjusting fabrication conditions including: deposition methods, deposition rate, gas pressure, substrate temperature and post fabrication treatment.

9. A thin film transistor with controllable threshold voltage and OFF state leakage current according to claim 1, further comprising a passivation layer deposited on said first active channel, wherein said thin film transistor is a n-channel transistor and said passivation layer contains negative fixed charges to reduce density of induced negative charges in said first active channel, materials of said passivation layer are selected from a group comprising: aluminum oxide, aluminum nitride, aluminum oxynitride, aluminum fluoride, hafnium oxide, nitrogen-doped $HfO_2$ and their mixtures; density of said negative fixed charges is controlled by fabrication conditions and material selection.

10. A thin film transistor with controllable threshold voltage and OFF state leakage current according to claim 1, further comprising a passivation layer deposited on said first active channel, wherein said thin film transistor is a p-channel transistor and said passivation layer contains positive fixed charges to reduce density of induced positive charges in said first active channel, materials of said passivation layer are selected from a group comprising: silicon nitride, silicon oxide, and silicon oxynitride, density of said positive fixed charges is controlled by fabrication conditions and material selection.

11. A thin film transistor with controllable threshold voltage and OFF state leakage current comprising:
a substrate,
a first gate electrode,
a first gate insulator layer containing a first fixed insulator charges with a controlled first fixed insulator charge density,
a drain,
a source; and
a first active channel,
wherein said first fixed insulator charges are negative for a n-channel transistor and positive for a p-channel transistor.

12. A thin film transistor with controllable threshold voltage and OFF state leakage current according to claim 11, wherein said thin film transistor is a n-channel transistor and said first fixed insulator charges are negative, said controllable threshold voltage and OFF state leakage current are achieved by adjusting the density of induced negative charges in said first active channel through controlling said first fixed insulator charge density during film deposition and post deposition treatment.

13. A thin film transistor with controllable threshold voltage and OFF state leakage current according to claim 11, wherein said thin film transistor is a p-channel transistor and said first fixed insulator charges are positive, said controllable threshold voltage and OFF state leakage current are achieved by adjusting the density of induced positive charges in said first active channel through controlling said first fixed insulator charge density during film deposition and post deposition treatment.

14. A thin film transistor with controllable threshold voltage and OFF state leakage current according to claim 11, wherein said threshold voltage and said OFF state current are further controlled by adjusting thickness of said first gate insulator layer.

15. A thin film transistor with controllable threshold voltage and OFF state leakage current according to claim 11, wherein said thin film transistor is a n-channel transistor and said first gate insulator is selected from a material group containing negative fixed charges including: aluminum oxide, aluminum nitride, aluminum oxynitride, aluminum fluoride, hafnium oxide, nitrogen-doped $HfO_2$ and their mixtures.

16. A thin film transistor with controllable threshold voltage and OFF state leakage current according to claim 11, wherein said thin film transistor is a p-channel transistor and said first gate insulator is selected from a material group containing positive fixed charges including: silicon nitride, silicon oxide, and silicon oxynitride.

17. A thin film transistor with controllable threshold voltage and OFF state leakage current according to claim 11, further comprising a passivation layer deposited on said active channel, said thin film transistor is a n-channel, transistor and said passivation layer contains negative fixed charges to reduce negative charges induced in said first active channel, materials of said passivation layer are selected from a group comprising: aluminum oxide, aluminum nitride, aluminum oxynitride, aluminum fluoride, hafnium oxide, nitrogen-doped $HfO_2$ and their mixtures; said threshold voltage and OFF state leakage current are controlled by controlling density of said negative fixed charges and thickness of said passivation layer; said density of said negative fixed charges is controlled by fabrication conditions and material selection.

18. A thin film transistor with controllable threshold voltage and OFF state leakage current according to claim 11, further comprising a passivation layer deposited on said active channel, said thin film transistor is a p-channel transistor and said passivation layer contains positive fixed charges to reduce unwanted positive charges induced in said active channel, materials of said passivation layer are selected from a group comprising: silicon nitride, silicon oxide, and silicon oxynitride, said threshold voltage and OFF state current are controlled by controlling density of said positive fixed charges and thickness of said passivation layer; said density of said positive fixed charges is controlled by fabrication conditions and material selection.

19. A thin film transistor array with controllable threshold voltage and OFF state leakage current comprising: a plurality of thin film transistors, each thin film transistor of said array having
a substrate,
a first gate electrode,
a first gate insulator layer containing first fixed insulator charges with a first fixed insulator charge density,
a second gate insulator layer containing second fixed insulator charges with a second fixed insulator charge density,
a drain,
a source,
a first active channel, and
wherein said first fixed insulator charges and said second fixed insulator charges have opposite signs, said first fixed insulator charge density and said second fixed insulator charge density are controlled during fabrication so that said first gate insulator layer and said second gate insulator layer forming an double layer gate insulator with a net charge density substantially smaller than said first fixed insulator charge density and said second fixed insulator charge density.

20. A thin film transistor array with controllable threshold voltage and OFF state leakage current as defined in claim 19, further comprising a passivation layer with a third fixed charges; sign of said third fixed charges is negative for n-channel thin film transistors and positive for p-channel thin film transistors.

* * * * *